United States Patent [19]

Keune et al.

[11] Patent Number: 5,801,543
[45] Date of Patent: Sep. 1, 1998

[54] DEVICE FOR TESTING PRINTED CIRCUIT BOARDS AND/OR FLAT MODULES

[75] Inventors: Andreas Keune, Celle; Uwe Kellermann, Hanover, both of Germany

[73] Assignee: ke Kommunikations-Elektronik GmbH & Co., Germany

[21] Appl. No.: 587,921

[22] Filed: Jan. 17, 1996

[51] Int. Cl.$^6$ .................................................. G01R 31/02
[52] U.S. Cl. ............................................................ 324/761
[58] Field of Search .................................... 324/761, 763

[56] References Cited

U.S. PATENT DOCUMENTS

| | | |
|---|---|---|
| 4,636,723 | 1/1987 | Coffin .................. 324/763 |
| 5,247,249 | 9/1993 | Seavey ................. 324/756 |

FOREIGN PATENT DOCUMENTS 3529207   3/1987   Germany .

*Primary Examiner*—Ernest F. Karlsen
*Assistant Examiner*—Anh Phung
*Attorney, Agent, or Firm*—Ware, Fressola, Van Der Sluys & Adolphson LLP

[57] ABSTRACT

A device for testing printed circuit boards and/or flat modules for electrical circuits is indicated, wherein at least one support plate (3) equipped with contact pins (4, 4') of different lengths is located in a housing (1). A cover plate (7) is positioned above the support plate (3) and contains at least one receptacle (10) for a test sample in the form of a printed circuit board or flat module. In addition, a unit (16) is provided for producing a partial vacuum to pull the test sample against the contact pins (4, 4'). To perform the in-circuit and the function tests, the underside of the cover plate (7) containing the receptacle (10) for the test sample has a slide (12) with spacers (15) protruding at right angles from one of its sides, which is able to move between two end positions, crosswise to the movement of the test sample. The slide (12) restricts the path of the test sample moving from its resting position by means of the partial vacuum, to two different planes in accordance with the different lengths of contact pins (4, 4').

6 Claims, 3 Drawing Sheets

DEVICE FOR TESTING PRINTED CIRCUIT BOARDS AND/OR FLAT MODULES

TECHNICAL FIELD

The invention concerns a device for testing printed circuit boards and/or flat modules for electrical circuits, in which at least one support plate with contact pins of different lengths is located in a housing, in which at least one receptacle for a test sample constructed as a printed circuit board or a flat module is located in a cover plate above the support plate, in which a unit that produces a partial vacuum to pull the test sample against the contact pins is provided, and in which a slide that is equipped with spacers protruding at right angles from one side, can move crosswise to the direction of movement of the test sample, whereby the path of the test sample, which moves from its resting position due to the partial vacuum, can be restricted to two different planes in accordance with the different lengths of the contact pins (DE-C-3 529 207).

BACKGROUND OF THE INVENTION

Such devices are used for the automatic testing of printed circuit boards or flat modules. For the sake of simplicity, only printed circuit boards are mentioned in the following. Such a device is used for example to perform the so-called in-circuit and function tests of a fully assembled printed circuit board. The cover plate, with a printed circuit board located in the receptacle, is pulled against the support plate by a partial vacuum, until the contact pins of the support plate make contact with the printed circuit board.

Devices whereby both tests can be performed in sequence, are sold for example by the U.S. Virginia Panel Corporation, Waynesboro, Va. A functional prototype of the test sample, and extensive electronics with an interface for connecting a test system or a computer and other additional functions, can be located in the housing of this device.

A corresponding device is also known from the above mentioned DE-C-3 529 207. Contact pins of different lengths are installed in the support plate of this device. The cover plate with the receptacle for a printed circuit board can be positioned in two different planes by means of the partial vacuum. For example, the in-circuit test is performed in the lower plane, in which all contact pins make contact with the printed circuit board. In the upper plane, which is then intended for the function test, only the longer contact pins make contact with the printed circuit board. A slide which is equipped with spacers and can move between two end positions, is provided to adjust the upper plane. In this known device, the slide is located on the support plate and is guided by guides attached thereto. An electric motor can be used to move it between the two end positions.

The U.S. Hewlett Packard Company has lately sold devices for testing printed circuit boards under the number 307X, which in this technical area conform to the standard of today with very short testing times. To utilize all the possibilities provided by a modern computer, nearly the entire surface of the support plate in these devices is equipped with contact pins. Thus, there is no room on the support plate for a slide which is able to move between two end positions. This modern device contains a corresponding contact pin connection to devices provided for this purpose, for example to perform the in-circuit test on printed circuit boards. With another arrangement of the contact pins, the device can be used for the function test. In practice, two separate devices are used for the two tests.

SUMMARY OF THE INVENTION

The invention has the task of configuring the above described device in a way to make it suitable for the automatic performance of both the in-circuit and the function tests, even with a support plate that is almost entirely covered with contact pins.

This task is fulfilled by the invention in that the slide is located on the underside of the cover plate that contains the receptacle for the test sample.

By locating the slide on the underside of the cover plate it is possible to utilize the known and proven slide to establish two different test planes in a simple way, even when a support plate, which is almost entirely covered with contact pins, is used in the device. By placing the slide on the underside of the cover plate, it is located in a place where not only space is available, but where it can also be mounted in a very simple manner. In the respective position of the slide, the spacers penetrate into gaps between the contact pins. Open areas for the spacers are not needed during the movement of the slide, since the spacers do not enter the contact pin area during this movement. No special care is required for the exact positioning and adjusting of the slide when it is mounted to the cover plate. This is because the cover plate does not have any contact pins, or sleeves for receiving them, which could possibly be damaged. It is also free of any other functional elements. This can be seen as an advantage, in case the slide must be replaced with a new one for some reason.

BRIEF DESCRIPTION OF THE DRAWINGS

A configuration example of the subject of the invention is schematically illustrated in the drawings, where.

BEST MODE FOR CARRYING OUT THE INVENTION

Figure 1:
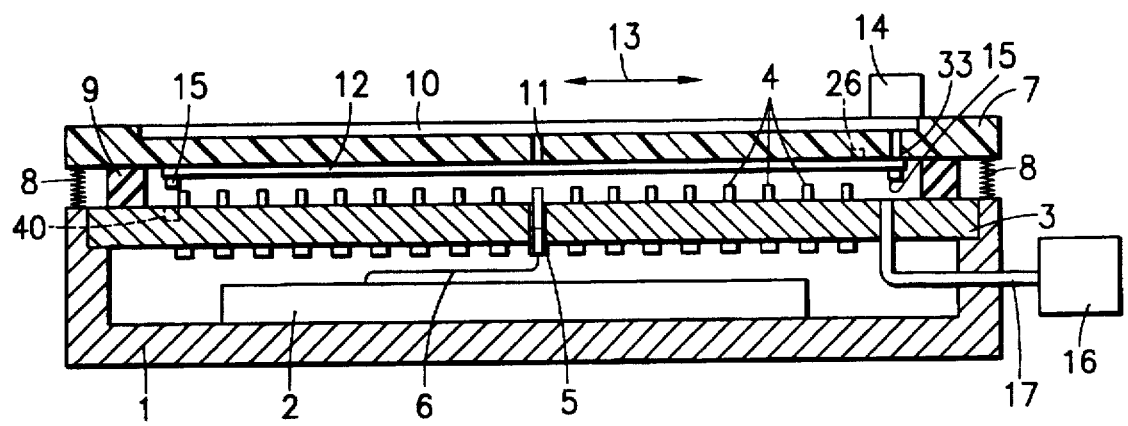
FIG. 1 is a cross section through a device according to the invention.
Figure 2:
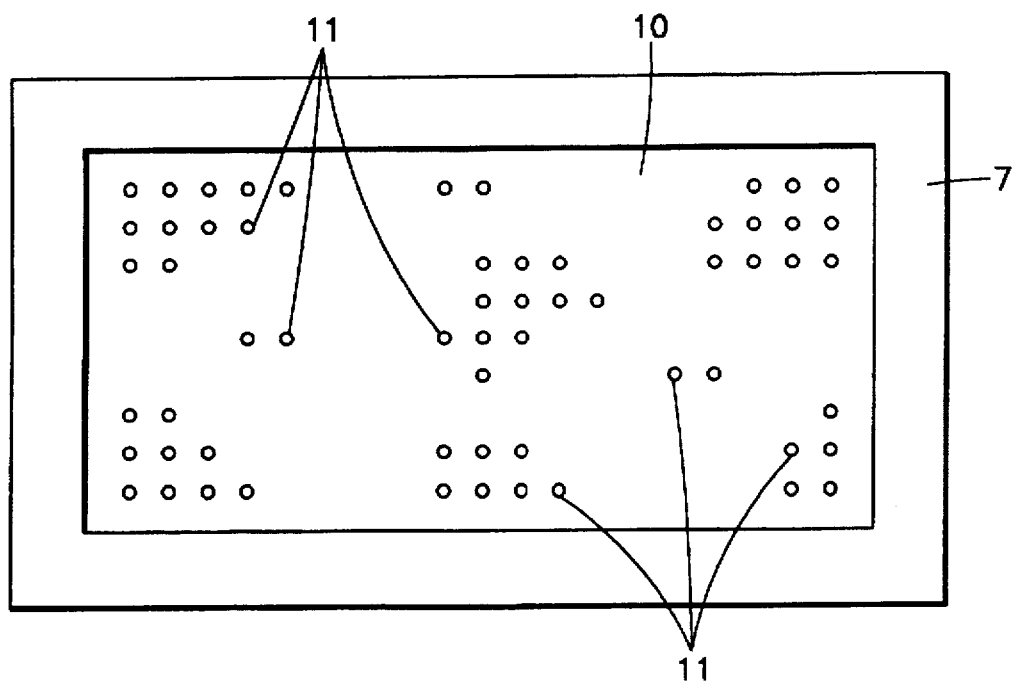
FIG. 2 is a top view of the device.

A box-shaped housing 1 with a rectangular base contains electronics 2 in the form of a block. These electronics contain the circuits required to perform in-circuit and function tests. Since these circuits are known, they will not be described here. A support plate 3 containing a large number of contact pins 4 and 4' is located on the upper edge of housing 1 and seals it tightly. The contact pins 4 and 4' are also basically known. They are inserted into sleeves 5 which in turn are attached to the support plate 3. For reasons of simplicity, only one sleeve 5 is drawn in FIG. 1. It penetrates through the support plate 3. An electric conductor 6 can be attached to the end protruding into the housing 1, to establish a connection with the electronics 2. The contact pins 4 and 4' are able to move in the axial direction inside of the sleeves 5. They are subjected to spring action. As best seen in FIG.

7, the contact pins 4 and 4' can have two different heights (lengths) with the larger pins shown by reference numeral 4'.

A cover plate 7 is located at a distance above the support plate 3. In the resting position depicted in FIG. 1, it is supported by springs 8 which are positioned around the housing 1 and in other places as well. An encircling seal 9 is positioned between the support plate 3 and the cover plate 7. In addition, the cover plate 7 has at least one receptacle 10 into which a printed circuit board can be inserted as a test sample. The cover plate 7 is equipped with a number of passage holes 11 corresponding to the number of contact pins 4 and 4', of which only one has been drawn, like the sleeve 5 in FIG. 1. The contact pins 4 and 4' can penetrate into the passage holes 11 to make contact with the printed circuit board.

Figure 5:
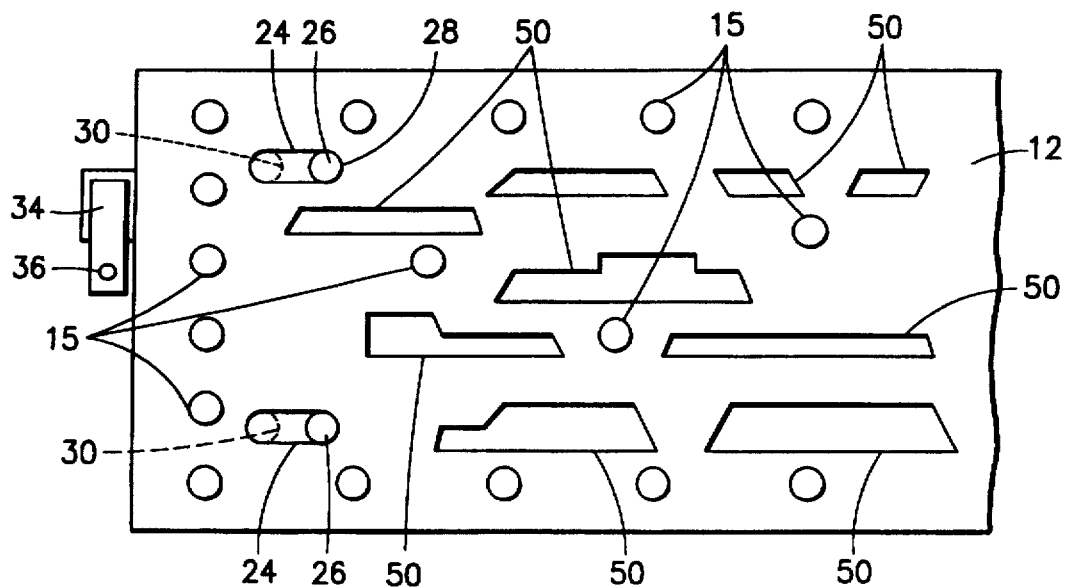
FIG. 5 is a view of the slide and drive mechanism taken along lines 5—5 in FIG. 3 illustrating the slotted holes in the slide for restricting the movement of the slide between end positions.

As best seen in FIGS. 1, 3, 4 and 5 the underside of cover plate 7 has a slide 12, which is able to move between two end positions 28 and 30 in the direction of the double arrow 13. The amount of travel between these two end positions is determined by the length of slotted holes 24 in slide 12, as best seen in FIG. 5. Restraining pins 26 depending from cover plate 7 (one such pin shown in phantom in FIGS. 1 and 3) thereby limit the movement of slide 12 between the first end position 28 when the pins 26 contact the right side of slotted holes 24 as shown in FIG. 5, to the second end position 30 when the pins 26 contact the left side of slotted holes 24. The slide further contains slots 16 for allowing pins 4, 4' to pass therethrough.

Figure 3:
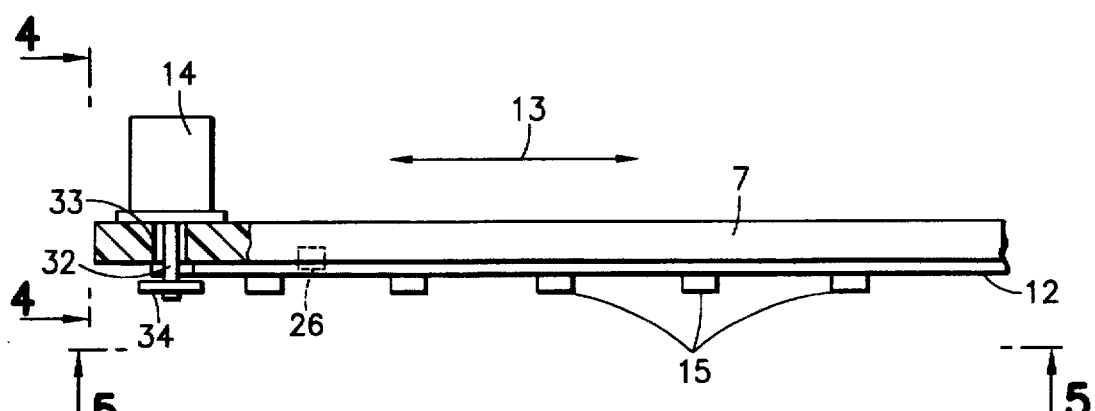
FIG. 3 is an enlarged, cross-sectional view of the portion of the cover plate where the motor is mounted.
Figure 4:
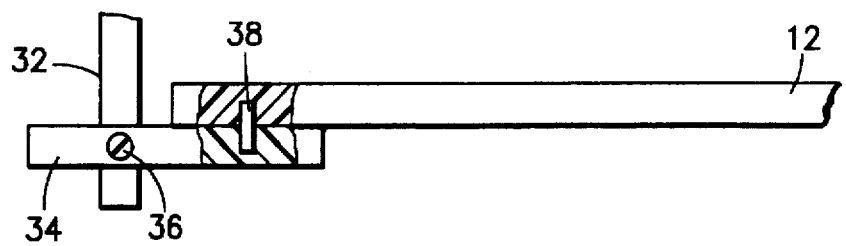
FIG. 4 is an enlarged view of the slide and drive mechanism taken along lines 4—4 in FIG. 3.

An electric motor 14, for example a D.C. motor, is preferably used for moving the slide. The motor is secured to cover plate 7 and has a shaft 32 that passes through a hole 33 in this plate. A metal arm 34 is secured to shaft 32 by pin 36. The arm at its other end is attached to slide 12 by pin 38, thereby moving the slide in the direction of double arrow 13. Spacers 15 protrude at right angles from one side of the slide 12, of which only two are drawn in FIG. 1 and additional spacers are shown in FIGS. 3 and 5.

An external unit 16 also belongs to the device. It produces a partial vacuum between the support plate 3 and the cover plate 7. A hose 17 connects the unit 16 to the space between support plate 3 and cover plate 7, for that purpose. This space is sealed from the outside by seal 9. The seal is preferably made of rubber or silicone rubber. In addition, the sleeves 5 in the support plate 3 are hermetically sealed.

Figure 6:
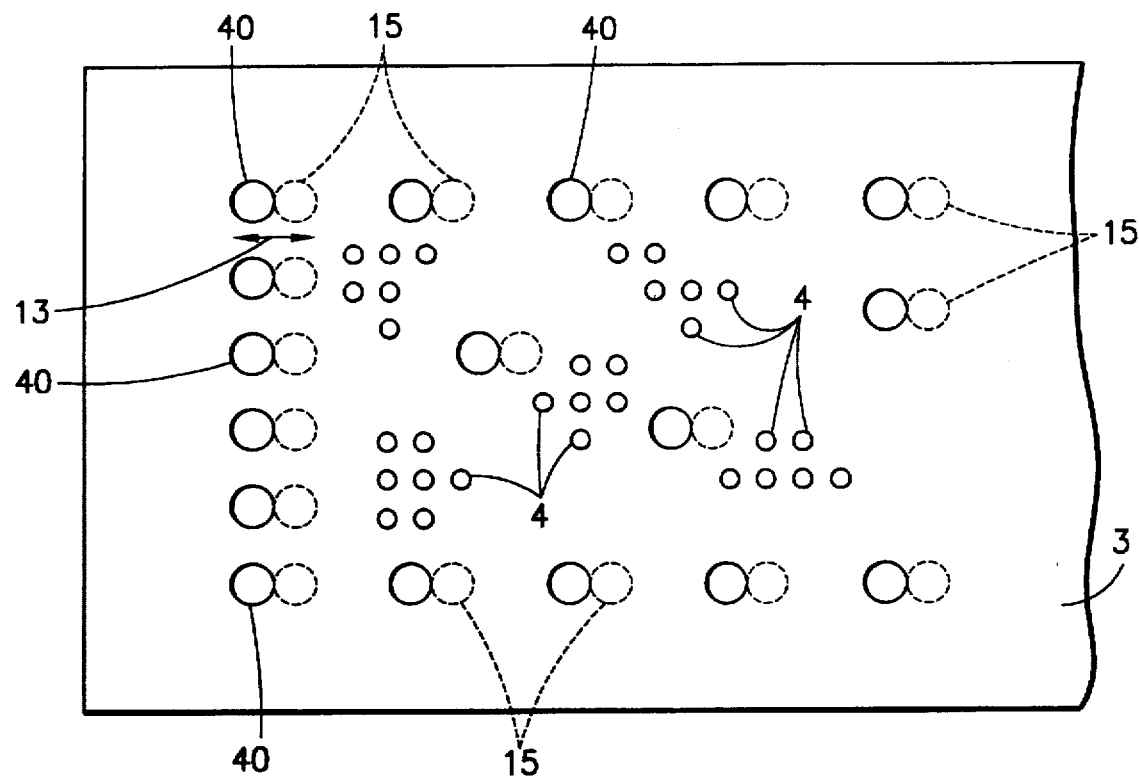
FIG. 6 is a plan view of the support plate showing the relative position of spacers as the slide moves between its two end positions and also illustrating the contact pins extending upward from the support plate.

Once a printed circuit board is inserted into the receptacle 10, all passage holes 11 in the cover plate 7 are covered. A partial vacuum can then be produced by the unit 16 which is located outside of the housing 1. The cover plate 7 with the printed circuit board is thereby pulled downward to a lower plane against the action of springs 8, until the printed circuit board contacts all contact pins 4 and 4' with sufficient pressure. As best seen in FIGS. 1 and 6, the spacers 15 have no effect at that moment, because the spacers penetrate into cutouts 40 in the support plate 3 (only one cutout 40 is shown in phantom in FIG. 1). The in-circuit test is performed in this lower plane of the cover plate 7 with respect to the printed circuit board.

Figure 7:
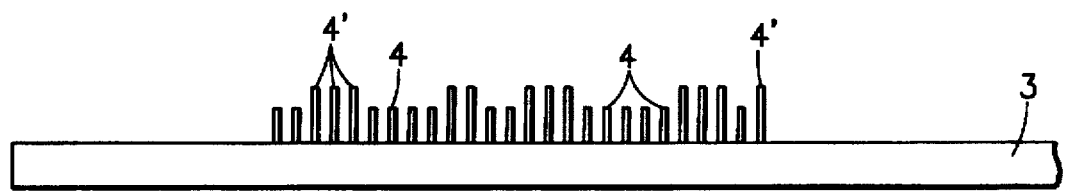
FIG. 7 is a side view of the support plate illustrating that the contact pins extending upward from the support plate can have two different heights.

For the function test, the cover plate 7 with the printed circuit board is moved to another plane, which lies above the lower plane. To that end the partial vacuum is reduced, so that the springs 8 can press the cover plate 7 upward to a predetermined extent. In this new position of cover plate 7, the slide 12 moves to its second end position. Increasing the vacuum again moves the cover plate 7 down again. However, its path is now restricted by the spacers 15, which abut against the support plate 3 as shown by spacers 15 in phantom. Arrow 13 illustrates the extent of movement in FIG. 6. As best seen in FIG. 7, this second end position causes the printed circuit board to only make contact with sufficient pressure against the longer contact pins 4' provided for the function test.

The partial vacuum is removed after completion of the two tests, which can also be performed in reverse order. The cover plate 7 returns to its resting position in FIG. 1. The printed circuit board can then be removed from the receptacle 10.

What is claimed is:

1. A device for testing printed circuit boards and/or flat modules for electrical circuits, in which a housing contains at least one support plate (3) equipped with contact pins (4, 4') of different lengths, said pins able to move in an axial direction within plate (3), where a cover plate (7) is positioned above the support plate and contains at least one receptacle (10) for a test sample in the form of a printed circuit board or flat module, wherein said pins are positioned on the support plate so as to substantially extend throughout the entire area of said receptacle (10) and thereby be able to contact the complete underside of a printed circuit board and/or flat module placed thereon, where a unit (16, 17) is provided to produce a partial vacuum for pulling the test sample against the contact pins, and where a slide (12) is provided, which can move between two end positions (28, 30) crosswise to the movement of the test sample, and has spacers (15) protruding at right angles from one side of the slide, to restrict the path of the test sample moving by means of the partial vacuum from its resting position, to two different planes in accordance with the different lengths of the contact pins, characterized in that the slide (12) is located on the underside of the cover plate (7) containing the receptacle (10) and wherein the slide (12) has at least one slotted hole (24) and the cover plate (7) has at least one depending restraining pin (26) for sliding engagement with the slotted hole so as to limit movement of the slide between the two end positions (28, 30), wherein a motor (14) is positioned on the cover plate (7), said motor having means (32, 34, 36, 38) for slidably engaging slide (12) so as to cause it to be movable between the two end positions (28, 30).

2. A device for testing printed circuit boards and/or flat modules for electrical circuits, comprising:

A) a support plate (3) having a plurality of contact pins (4, 4') positioned therein so as to extend above a first plane of the support plate, the pins positioned within the support plate so as to be movable in the axial direction of the pins, at least some of the pins (4') extending above the first plane a greater distance than the remaining pins (4) when said pins (4, 4') are not in contact with an object, the support plate also having a plurality of cutouts formed in the first plane of the support plate;

B) a cover plate (7) positioned above the support plate (3), the cover plate having at least one receptacle (10) for receipt of a test sample in the form of a printed circuit board or flat module;

C) means (16, 17) for controllably producing a partial vacuum between the space defined by the cover plate and support plate so as to pull the cover plate toward the support plate and thereby cause the test sample to contact the contact pins;

D) a slide (12) positioned on the underside of cover plate and above the support plate, the slide positioned on the cover plate so as to be movable between first and second end positions (28, 30), said movement of the slide crosswise to the movement of the support plate when the partial vacuum is present, and further wherein the slide (12) has at least one slotted hole (24) and the cover plate (7) has at least one depending restraining pin (26) for sliding engagement with the slotted hole so as to limit movement of the slide between the first and second end positions (28, 30);

E) spacers (15) depending from the slide dimensioned for fitting within the cutouts in the support plate when the slide is in the first end position but contacting the first plane of the support plate when the slide is in its second end position; and F) means (14, 32, 34), attached to the cover plate (7), for moving the slide between its first and second end positions;

wherein said pins are positioned on the support plate so as to substantially extend throughout the entire area of said receptacle (10) and thereby be able to contact the complete underside of a printed circuit board and/or flat module placed thereon, whereby all the pins (4, 4') are contacted by the test sample when the slide is in its first end position (28) and only the pins (4') extending above the support plate a greater distance than the remaining pins (4) are contacted when the slide is in its second end position (30).

3. A device as defined in claim 2, wherein the cover plate (7) has a plurality of passage holes (11) formed therein that are positioned in alignment with the contact pins (4, 4') so as to make electrical contact between the contact pins and the test sample when the cover plate is pulled toward the support plate.

4. A device as defined in claim 3, having a resilient seal (9) positioned between the cover plate and support plate so as to maintain the partial vacuum therebetween.

5. A device as defined in claim 2, wherein the cover plate (7) has a plurality of passage holes (11) formed therein that are positioned in alignment with the contact pins (4, 4') so as to make electrical contact between the contact pins and the test sample when the cover plate is pulled toward the support plate.

6. A device as defined in claim 2, having a resilient seal (9) positioned between the cover plate and support plate so as to maintain the partial vacuum therebetween.

* * * * *